US012016141B2

United States Patent
Schwarz

(10) Patent No.: US 12,016,141 B2
(45) Date of Patent: Jun. 18, 2024

(54) ELECTRONIC COMPONENT AND METHOD FOR COOLING

(71) Applicant: Eaton Intelligent Power Limited, Dublin (IE)

(72) Inventor: Bernd Schwarz, Eberbach (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 840 days.

(21) Appl. No.: 16/465,884

(22) PCT Filed: Dec. 1, 2017

(86) PCT No.: PCT/EP2017/081219
§ 371 (c)(1),
(2) Date: Aug. 21, 2019

(87) PCT Pub. No.: WO2018/100175
PCT Pub. Date: Jun. 7, 2018

(65) Prior Publication Data
US 2019/0387636 A1 Dec. 19, 2019

(30) Foreign Application Priority Data
Dec. 2, 2016 (DE) .......................... 102016224064.1

(51) Int. Cl.
*H05K 7/20* (2006.01)
*F21V 25/12* (2006.01)
(Continued)

(52) U.S. Cl.
CPC ........... *H05K 5/0213* (2013.01); *F21V 25/12* (2013.01); *F21V 29/56* (2015.01); *H05K 7/20209* (2013.01); *H05K 7/20327* (2013.01)

(58) Field of Classification Search
CPC ............. H05K 5/0213; H05K 7/20209; H05K 7/20327; F21V 25/12; F21V 29/56
See application file for complete search history.

(56) References Cited

U.S. PATENT DOCUMENTS 6,462,949 B1 * 10/2002 Parish, IV .......... F28D 15/0266
361/689
8,154,864 B1 * 4/2012 Nearman ............. G09F 9/3026
361/679.01
(Continued)

FOREIGN PATENT DOCUMENTS

CN 101446476 A 6/2009
CN 103413794 A 11/2013
(Continued)

OTHER PUBLICATIONS

International Search Report for PCT/EP2017/081219, dated Feb. 14, 2018, 3 pages.

*Primary Examiner* — Jacob R Crum
(74) *Attorney, Agent, or Firm* — Stinson LLP

(57) ABSTRACT

The invention relates to electrical/electronic equipment, such as a high-powered lamp, switching device, control device, transformer, signaling device, display device, or the like, having a housing (2) and at least one cooling fluid supply apparatus (3) arranged in the housing or allocated thereto. Said cooling fluid supply apparatus has a cooling fluid inlet apparatus and a cooling fluid discharge apparatus on the housing and a cooling fluid guide apparatus within the housing.

In order to improve such equipment such that safe actuating of the equipment is possible, together with a compact and competitive design, with simultaneously efficient cooling, in particular also in potentially explosive areas, at least the cooling fluid inlet apparatus is allocated a safety switching apparatus for interrupting the cooling fluid supply, in particular in the case of a pressure drop in the cooling fluid. The invention also relates to a corresponding method.

16 Claims, 2 Drawing Sheets

(51) Int. Cl.
    *F21V 29/56*    (2015.01)
    *H05K 5/02*    (2006.01)

(56)            References Cited

U.S. PATENT DOCUMENTS

2003/0052584 A1    3/2003   Matsui et al.
2005/0030752 A1*   2/2005   Imai .................... H01L 33/60
                                                   257/E33.059
2007/0091622 A1    4/2007   Huang et al.
2011/0100597 A1    5/2011   Wang et al.
2012/0293535 A1   11/2012   Nozawa
2013/0205822 A1*   8/2013   Heiland ................. F25D 31/00
                                                       62/259.2
2014/0226328 A1*   8/2014   Schwarz .................. F21S 4/28
                                                       362/235
2015/0308673 A1*  10/2015   Burmeister ........... F21V 19/002
                                                     362/249.02
2016/0120065 A1*   4/2016   Shedd .................. F25B 23/006
                                                      165/104.29
2016/0143185 A1*   5/2016   Campbell .......... H05K 7/20327
                                                      165/104.31
2017/0130746 A1    5/2017   Taupeau et al.

FOREIGN PATENT DOCUMENTS

CN         106122800 A      11/2016
DE       202009007810 U1    11/2010
DE       102010017460 A1    12/2011
DE       102013104627 B3     9/2014
EP           2112432 A1  *  10/2009   ............. F21V 25/12
JP          2011103261 A     5/2011
WO          02/093339 A1    11/2002

* cited by examiner

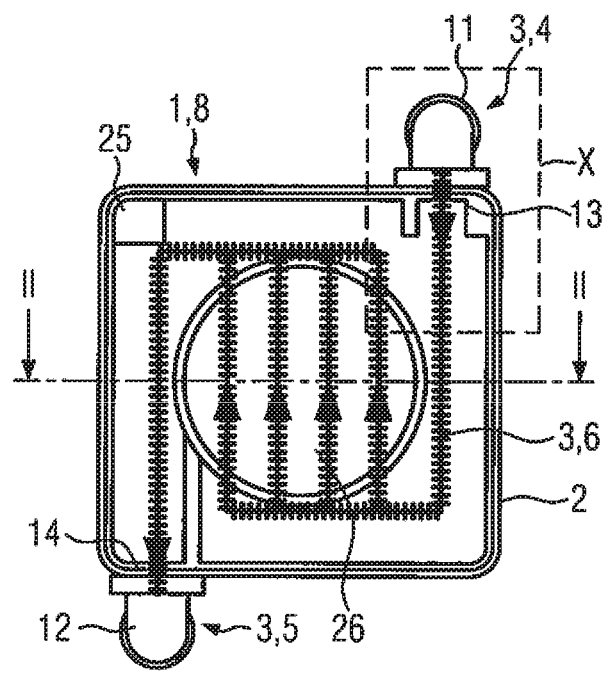
FIG. 1
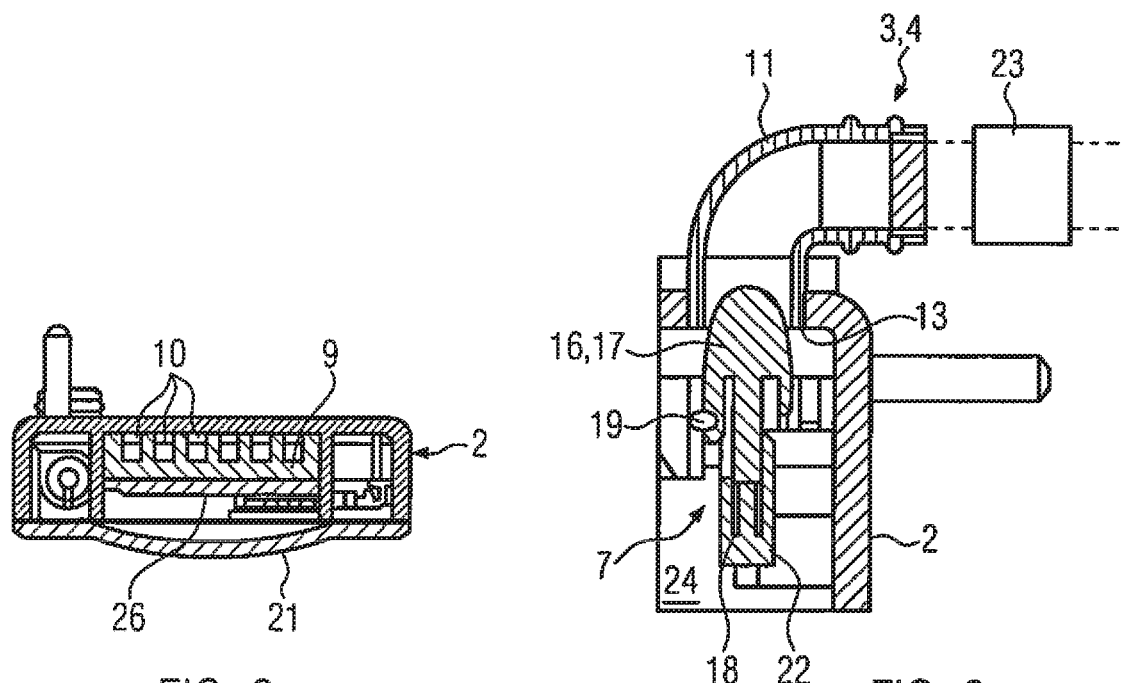
FIG. 2
FIG. 3

ELECTRONIC COMPONENT AND METHOD FOR COOLING

CROSS-REFERENCE TO RELATED APPLICATIONS

This application is a National Stage Entry of, and claims priority to, PCT Patent Application No. PCT/EP2017/081219, filed Dec. 1, 2017, which claims priority to German Patent Application No. 102016224064.1, filed Dec. 2, 2016, both of which are hereby incorporated by reference in their entirety.

FIELD OF THE DISCLOSURE

The invention relates to electrical or electronic equipment, such as a high-powered lamp, switching device, control device, transformer, signaling device, display device, or the like.

BACKGROUND

Such equipment, like other compact electronic parts, generates heat which must be dissipated in order to prevent damage to the corresponding components and in particular also to increase the service life of the components. Additional requirements for such equipment, for instance, limiting the surface temperature or reliably controlling sparks in order to prevent an explosion, exist in explosion-protected areas.

In other words, cooling is essential for corresponding equipment. So far, such cooling has, for example, been effected by a passive cooling device, such as a cooling body with corresponding cooling fins, or the like, or also by an active cooling, such as a fluid cooling in particular using a corresponding liquid. In such a fluid cooling, the cooling fluid is supplied to a housing of the equipment by means of a cooling fluid supply apparatus. This apparatus generally has at least one cooling fluid inlet apparatus and one cooling fluid discharge apparatus. The cooling fluid is introduced into the housing via the cooling fluid inlet apparatus and correspondingly discharged from the housing again via the cooling fluid discharge apparatus. Disposed within the housing is a cooling fluid guide apparatus which connects the cooling fluid inlet apparatus and the cooling fluid discharge apparatus and which guides the cooling fluid through the housing and in particular in close proximity to those components of the equipment that mainly generate the high temperatures.

Heat generation is sometimes critical, especially in connection with the corresponding high-powered components, and the cooling fluid supply apparatus must be designed accordingly in order to keep the temperatures of the equipment below a maximum permissible temperature.

It has however been found that, with the cooling fluid supply apparatuses hitherto known from practice, cooling or at least adequate cooling is no longer possible, for example, in the case of a leak in the cooling fluid circuit, a high temperature inside the housing of the equipment and the ensuing evaporation of the coolant and the like. In addition, equipment operating at excessively high temperatures can present a danger especially in potentially explosive areas.

SUMMARY OF THE DISCLOSURE

The object of the invention is therefore to improve the equipment described above and the corresponding method for cooling and monitoring the equipment such that safe actuating of the equipment is possible together with a compact and competitive design, with simultaneously efficient cooling, in particular also in potentially explosive areas.

This object is achieved by the features of the independent claims.

According to the invention, this object is achieved, in particular, by at least the cooling fluid inlet apparatus being allocated a safety switching apparatus for interrupting the supply of fluid in particular in the case of a pressure drop in the fluid. This also applies analogously to a higher pressure present in the housing than in the fluid inlet apparatus if, for example, a part of the cooling fluid in the housing evaporates due to the heat generated by the components of the equipment.

In this context, the safety switching apparatus prevents an insufficient supply of the cooling fluid and at the same time serves to switch off the equipment so that no further heat is generated.

Otherwise, during normal operation, the cooling fluid is appropriately supplied to the housing by the cooling fluid supply apparatus. This supply of the cooling fluid cools the equipment sufficiently. Only when there is a relevant pressure drop in the cooling fluid supply and/or a temperature rise within the housing up to a maximum permissible temperature value, the safety switching apparatus then correspondingly interrupts both the cooling fluid supply and the power supply to the equipment.

Reliable operation of the equipment is thereby possible since it is automatically switched off when a predetermined maximum temperature is reached due to a malfunction or insufficient cooling. Safe actuating in potentially explosive areas is also made possible as a result. Due to the equipment being switched off when a predetermined maximum temperature is reached, the service life of the corresponding components of the equipment is also extended as regards the cooling otherwise present.

One example of such equipment is a high-powered lamp having at least one in particular high-powered LED, H-LED, as illuminant. Of course, a plurality of such H-LEDs can also be used in the lamp, or other equipment, as already mentioned at the outset, can also be cooled correspondingly; in this connection, see switching devices, control devices, transformers, signaling devices, and the like.

There is also the possibility of cooling not only one high-powered lamp as equipment but also a plurality of such equipment, which may also be included in a larger electrical system. The previous and following explanations relating to cooling apply both to a single item of equipment of different types and also to an arrangement of a plurality of equipment or electrical installations having such equipment.

It has already been pointed out that the invention can also be used in particular for equipment which is explosion-protected and designed in particular with explosion protection types Ex-d, Ex-m, Ex-o, or Ex-p.

Ex-d denotes an ignition protection type in which parts which could ignite an explosive atmosphere are arranged in a housing. This housing will withstand the pressure of an explosion inside the housing and prevent transmission of the explosion to the surrounding explosive atmosphere.

In the case of ignition protection type Ex-m, an encapsulation is present. In other words, the corresponding parts of the equipment are embedded in a potting compound such that they would not be able to ignite an explosive atmosphere outside of a housing. The corresponding potting compound is resistant to electrical, thermal, mechanical, or chemical influences.

In the case of ignition protection type Ex-o, corresponding parts of the equipment are immersed in electrically insulating oil or another non-flammable liquid so that gases and vapors present above the corresponding liquid level within the housing or even outside the housing cannot be ignited by sparks or the like.

Explosion protection class Ex-p uses a pressurized enclosure which prevents the surrounding atmosphere from penetrating into the housing of the equipment. For this purpose, a corresponding protective gas, such as air or another suitable gas, is disposed within the housing. This gas is kept within the housing under excess pressure in comparison to the surrounding atmosphere.

All of these protection types can easily be realized according to the invention.

In order to improve the cooling if necessary and to simplify heat dissipation from the corresponding components of the equipment toward the cooling fluid, a passive cooling device can be arranged within the housing and/or on the housing. The passive cooling device may also be in contact with the cooling fluid. It is also conceivable that the passive cooling device, in addition to the cooling fluid, provides a corresponding cooling of the equipment in particular when the passive cooling device is arranged on the outside of the housing.

In order to guide the cooling fluid into the housing, through the housing, and out of the housing again, the fluid line connection can have a plurality of fluid channels. These fluid channels are arranged, for example, inside the housing and/or also inside or on the passive cooling device. Depending on the cooling fluid used, it is likewise conceivable for the cooling fluid to be in direct contact with the various components of the equipment, providing it has the corresponding property of electrical insulation (in this connection, see also, for example, protection type Ex-o) or for the fluid channels to be at least partially arranged in particular in the area of the heat source.

In order to easily enable cooling fluid to be supplied to and discharged from the housing, the cooling fluid inlet apparatus and/or the cooling fluid discharge apparatus can have at least one pipe socket which projects outward from the housing and which in each case has a pipe opening that is open toward the housing interior. Of course, other ways of supplying and discharging the cooling fluid are possible, such as corresponding holes in the housing which are connected on the outside of the housing to cooling fluid lines.

In order to be able to construct the safety switching device in a simple manner, especially in the area of the cooling fluid inlet apparatus, it can have a valve body to which pressure is applied toward the pipe opening of the pipe socket and which is movably mounted between an open and a closed position. When the cooling fluid supply pressure drops, the valve body is moved automatically into the closed position. This applies analogously also in the event of a high pressure build-up in the housing interior, which is possible, for example, in the case of a cooling fluid at least partially evaporating due to an excessively high temperature. Analogously, the valve body will move toward the closed position if, for example, too little cooling fluid and therefore too low a cooling fluid pressure is present due to a leak in the cooling fluid supply line.

A simple way of applying pressure is to use a spring element, which is mounted within the housing and presses the valve body toward the pipe opening of the pipe socket.

Various possibilities are conceivable for linking the corresponding movement of the valve body or the state of the safety switching apparatus to the electrical supply of the equipment. If the valve body is in the closed position or the safety switching apparatus is switched off, the electrical supply to the equipment is interrupted at the same time. This applies in particular because in these cases, the further supply of cooling fluid is always interrupted and adequate cooling of the components of the equipment is not ensured.

A simple way of linking the position of the valve body to an interruption in the power supply to the equipment can be seen when the valve body is allocated to an electrical contact element which, in particular in the closed position of the valve body, opens an electrical breaker contact to interrupt the power supply to the equipment. If the valve body is not in the closed position, the breaker contact is closed by the corresponding contact element of the valve body and the power supply to the equipment is maintained.

It is possible for the power supply to be interrupted directly when the breaker contact is opened. It is also conceivable for the breaker contact to be in communication with a control device of the equipment. The control device then interrupts the power supply to the equipment when the breaker contact is opened. The control device can likewise be superordinate, i.e. it can be allocated to several units of equipment. In the case of failure of a corresponding item of equipment, the item of equipment can then be switched off by the control device due to the open breaker contact.

In particular, in the case of equipment in the form of a high-powered lamp, it is furthermore advantageous if, where appropriate, the housing has at least one transparent cover facing the corresponding illuminant. The housing and cover may be connected together by friction welding or the like. Such a connection is also advantageous in the context of a corresponding ignition protection type of the equipment.

In order to mount the valve body in a simple manner within the housing so that it can move between its various positions, the valve body can be movably mounted in a bearing sleeve, wherein the spring element for applying pressure to the valve body is in particular arranged between the bearing sleeve and the valve body.

In connection with explosion protection, a corresponding surface temperature of the electrical/electronic equipment should also be considered. This surface temperature should always be lower than an ignition temperature of any gas or vapor mixture which might be present. This relation between maximum surface temperature and ignition temperature prevents an ignition of an explosive mixture. In this context, items of electrical equipment are allocated to temperature classes. The temperature classes are designated as T1 to T6, wherein, for example, the temperature class T6 permits a maximum permissible surface temperature of the equipment of 85° C., while correspondingly the ignition temperatures of the combustible substances are higher than 85° C. In temperature class T3, the maximum permissible surface temperature is 200° C., while correspondingly the ignition temperatures of the combustible substances are higher than 200° C.

According to the invention, it is advantageous in this context if, where applicable, the cooling fluid has a boiling temperature lower than a corresponding maximum permissible surface temperature or temperature according to the corresponding temperature class of the equipment. In other words, even before the maximum permissible surface temperature is reached, the cooling fluid boils so that the pressure inside the housing rises and the cooling capacity is additionally increased for a short time by the phase transition from liquid to gas. This leads to the safety switching apparatus being switched off and to the valve body being moved into the closed position and correspondingly to the power supply to the equipment being interrupted. In addition, an Ex-p ignition protection type thereby arises since the correspondingly high pressure inside the housing prevents an intrusion of explosive gases present outside the housing.

Without such an overpressure in the housing, it is however advantageous when a cooling fluid pressure in the area of the cooling fluid inlet apparatus is higher than the pressure applied to the valve body toward the closed position. This ensures that sufficient cooling exists during normal operation of the equipment; in other words, no pressure drop in the cooling fluid and no evaporation of the cooling fluid.

The cooling fluid can be selected according to how the equipment is used, in particular with regard to explosive gases which might be present. This applies in particular in connection with the boiling temperature of the cooling fluid, which should always be lower than the maximum permissible surface temperature of the equipment. Such coolants are, for example, corresponding insulating oils, 3M Novec™ or even distilled water. In particular, 3M Novec™ is distinguished by a wide range of boiling points, is not flammable and furthermore has excellent insulating properties.

If, for example, oil or another fluid is used, the corresponding ignition protection type Ex-o results at the same time.

In order to cool the cooling fluid in a simple manner, in particular outside the housing, a heat exchanger may be arranged at an appropriate location outside the housing between the cooling fluid inlet apparatus and the cooling fluid discharge apparatus. This applies analogously also to a plurality of equipment with corresponding cooling, wherein a heat exchanger may be sufficient in this connection.

It has already been pointed out that when the valve body is in the closed position, a corresponding pressurized enclosure according to Ex-p of the housing is present; see the evaporation of the cooling fluid at a correspondingly higher temperature of the equipment.

According to the invention, the cooling fluid for cooling the housing is generally supplied by means of the corresponding cooling fluid supply apparatus. However, the cooling fluid inlet apparatus is closed if a pressure drop in the cooling fluid occurs and/or a temperature rise within the housing exists, which goes beyond a predetermined temperature. Closing is effected by an appropriate application of pressure to a valve body; see the corresponding spring element. Simultaneously with a movement of the valve body into the closed position, the power supply to the equipment is interrupted. In other words, it is ensured that the equipment is switched off, not only in the case of a pressure drop in the cooling fluid but also in the case of an excessive temperature rise within the housing.

In the case of the corresponding cooling fluid, it should further be noted that the cooling fluid additionally cools the equipment by evaporation so that even with a very high surface temperature of the equipment, the cooling is first improved (see evaporation heat) and due to the overpressure building up inside the housing, the safety switching device is simultaneously actuated (closed position) so that the power supply to the equipment is switched off.

The invention also relates to a safety switching apparatus according to the above-described type.

BRIEF DESCRIPTION OF THE DRAWINGS

The invention is explained and described in more detail with reference to the figures appended in the drawings, in which:

FIG. 1 is a plan view of an item of electrical/electronic equipment according to the invention with an indicated course of a cooling fluid;

FIG. 2 is a section along line II-II in FIG. 1;

FIG. 3 is an enlarged view of detail X in FIG. 1;

DETAILED DESCRIPTION

Figure 4:
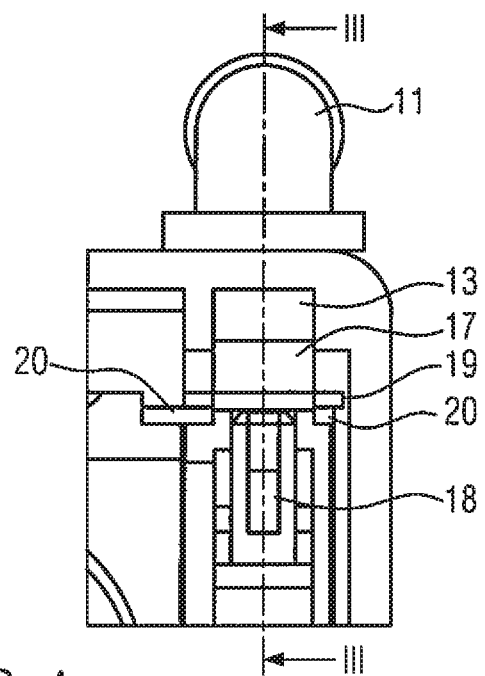
FIG. 4 is a valve body of a safety switching apparatus according to the invention in the open position.

FIG. 1 shows a plan view of an item of electrical/electronic equipment 1 according to the invention. This equipment is a high-powered lamp 8 having at least one high-powered LED 26, hereinafter referred to as H-LED. The lamp has a housing 2 which, in the illustrated view, is essentially square, although other forms of housing are also possible. The H-LED 26 is arranged inside the housing. A cooling fluid supply apparatus 3 is allocated to the H-LED 26 and in particular also to the housing 2. Of the cooling fluid supply apparatus 3, only a cooling fluid inlet apparatus 4 and a cooling fluid discharge apparatus 5 are shown in the form of pipe sockets at diagonally opposite ends of the housing. The cooling fluid inlet apparatus and cooling fluid discharge apparatus are connected outside the housing to other housings and to the rest of the cooling fluid supply apparatus 3. The cooling fluid supply apparatus 3 may also have a heat exchanger 23; see FIG. 3.

Inside the housing, appropriate cooling fluid passes through a cooling fluid guide apparatus 6, for example, in the form of a plurality of fluid channels 10. The cooling fluid guide apparatus 6 is part of the cooling fluid supply apparatus 3 of the equipment 1.

Cooling fluid is supplied to the housing 2 via the cooling fluid inlet apparatus 4, flows through the housing in the corresponding fluid channels 10 while cooling devices of the equipment, and exits the housing again via the cooling fluid discharge apparatus 5. The corresponding pipe sockets 11 and 12 are directed away from the viewer in FIG. 1; see also the following FIGS. 3, 4 and 5.

FIG. 2 shows a section along the line II-II in FIG. 1 through the equipment 1. The housing 2 is closed on an open light-exit side by means of a cover 21 made of a transparent material. The connection between cover 21 and housing 2 may be effected, for example, by friction welding or the like. The approximately circular H-LED 26 (see also FIG. 1) is arranged within the housing. The H-LED 26 is arranged with its rear side on a passive cooling device 9 in the form of a heat sink with a plurality of cooling fins. The spaces between the cooling fins serve as corresponding fluid channels 10.

The equipment 1 or the corresponding high-powered lamp 8 can be designed in accordance with the corresponding explosion protection conditions. Ignition protection types in this connection are Ex-d, Ex-m, or in particular Ex-o, which becomes Ex-p in the event of a fault. The H-LED 26 can be arranged within the housing 2 as an individual illuminant or with a plurality of illuminants. The arrangement of the H-LEDs can also take the form of an LED arrangement of columns and rows. The H-LED is characterized by a high power consumption and a high light output.

It is possible for the cooling fluid to flow not only along the fluid channels 10 but entirely through corresponding cavities in the housing 2. For this purpose, the cooling fluid is selected to be electrically insulating and of low flammability.

Figure 5:
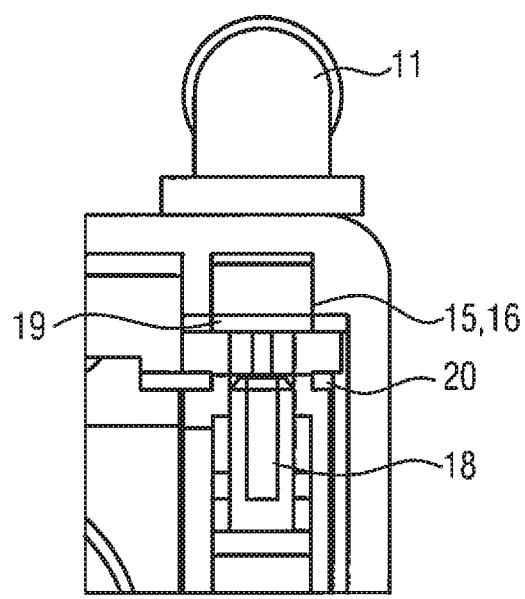
FIG. 5 is a valve body according to FIG. 4 in the closed position.

FIG. 3 shows a section along the line III-III in FIG. 4, wherein FIG. 4 is an enlarged view of the detail X in FIG. 1.

FIG. 3 shows in particular a safety switching apparatus 7. This safety switching apparatus 7 is used to open and close the pipe socket 11 and in particular a pipe opening 13 of the pipe socket 11 that points toward the housing interior 24. The pipe socket 11 is part of the cooling fluid inlet apparatus 4. The cooling fluid inlet apparatus 4 is connected on the outside of the housing to cooling fluid lines, not shown in more detail, which extend for example toward a heat exchanger 23. The heat exchanger 23 can then in turn be connected to a corresponding cooling fluid discharge apparatus 5.

The safety switching apparatus 7 comprises a valve body 17, an electrical contact element 19, and a spring element 18 for applying pressure to the valve body in the closed position. The closed position 16 is shown, for example, in FIGS. 3 and 5. A corresponding open position 15 is shown in FIG. 4. In the closed position 16 according to FIGS. 3 and 5, the electrical contact element 19 of the valve body 17 is separated from an electrical breaker contact 20 inside the housing 2. In the open position 15 according to FIG. 4, the electrical contact element closes the electrical breaker contact.

A control device 25 is also arranged inside the housing 2; see FIG. 1. When the contact element and the breaker contact are disconnected, said control device can interrupt the power supply to the H-LED 26. The corresponding interruption in the power supply can also be effected directly by the separation of contact element and breaker contact.

The control device can also switch off not only the lamp 8 shown but also other items of equipment 1 connected to the same cooling fluid supply apparatus 3.

The corresponding contact element 19 of the valve body 17 can, for example, be annular in shape and extend around the valve body 17. The corresponding electrical breaker contact points at least at two locations toward the valve body and makes contact with the annular electrical contact element 19, when the valve body 15 is in the open position. The figures also show the corresponding pipe openings 13 and 14 of the pipe sockets 11 and 12; see, for example, FIG. 1 or also FIGS. 3 to 5.

The valve body has a valve head which has an enlarged diameter and which in the closed position 16 closes the corresponding pipe opening 13. In addition, the valve body 17 has a stem with a smaller diameter than the valve head, wherein this valve stem is movably mounted in a bearing sleeve 22. The corresponding spring element 18 for applying pressure to the valve body toward the closed position 16 is arranged in this bearing sleeve 22.

If cooling fluid flows into the housing via the cooling fluid inlet apparatus 4, i.e. via the pipe socket 11 and pipe opening 13, with a corresponding cooling fluid pressure, the valve body 16 is moved against the pressure being applied to the spring element 18 into the open position; see FIG. 4. As a result, the cooling fluid is able to flow into the housing and in particular into the fluid channels 10 via the pipe opening 13. It flows along the corresponding components of the equipment, such as the H-LED or also the control device. As a result, the latter are cooled directly or at least via the passive cooling device 8. Subsequently, the heated cooling fluid exits the housing 2 via the pipe opening 14 and pipe socket 12 of the cooling fluid discharge apparatus 5. Outside the housing 2, it is then cooled by the heat exchanger 23 and can continue its circulation. In the process, it can also flow through other items of equipment 1 which, for the sake of simplicity, are not shown in the figures. Overall, the cooling fluid supply device 3 can also be used for a series of items of equipment of different types of an electrical system.

If a loss of cooling fluid occurs, the pressure in the cooling fluid flow drops. This pressure drop can become so great that the pressure applied to the valve body 17 suffices to move the valve body into the closed position 16. In this position, the electrical contact element is separated from the breaker contact and the equipment is thereby switched off by switching off the power supply. Even with the valve body in the open position, it is also possible for the temperature of the operating medium to exceed a predetermined critical maximum value because the equipment is defective or was damaged in another way, for example. If this temperature is exceeded, the cooling fluid evaporates. In the case of the equipment according to the invention, it is generally determined that a permissible surface temperature of the equipment or the H-LED is lower than a boiling temperature of the cooling fluid. Only in the event of a fault is the boiling temperature exceeded by the corresponding surface temperature so that evaporation of the cooling fluid begins. This evaporation causes the pressure within the housing to rise and thus, in addition to the spring loading of the valve body, the valve body is moved into the closed position 16 by the increased internal pressure. As a result, the power supply to the equipment is also interrupted.

As already stated, the boiling temperature of the cooling fluid is usually selected such that it is lower and generally considerably lower than the permissible surface temperature of the equipment. This surface temperature is determined, for example, by the corresponding temperature classes. These temperature classes are denoted by the letters T1 to T6. T6 corresponds to a maximum surface temperature of 85° C. and T1 to a maximum surface temperature of 450° C.

The evaporation of the cooling fluid results in a further advantage according to the invention in that the corresponding evaporation energy during the phase transition can additionally be used to cool the equipment. As a result, the cooling effect is increased before actual failure of the equipment due to a defect and the power supply to the equipment is then interrupted in the aforementioned manner. In other words, according to the invention, it is ensured that even in the case of an elevated surface temperature, sufficient cooling is available until the equipment is switched off.

Another advantage in this context is that the internal pressure in the housing 2 rises due to the evaporation, which corresponds, for example, to explosion protection type Ex-p. In other words, the increased pressure inside the housing prevents the intrusion of possibly explosive gases or the like. This is supported by the closing of the corresponding pipe opening 13 by the valve body 17 in the closed position 16.

It follows from the aforesaid that the invention can be used with the corresponding explosion-proof equipment in particular in potentially explosive areas.

In other words, according to the invention, not only is the explosion protection maintained by, for example, limiting the possible surface temperatures but also reliability is simultaneously improved by preventing the corresponding components of the equipment from overheating. If, for example, oil or another fluid is used as the cooling fluid, the housing can be designed in explosion protection type Ex-o.

This results in an excellent cooling of the equipment and at the same time the realization of the corresponding explosion protection type.

The design according to the invention of the cooling fluid supply apparatus enables the equipment to have a compact design with a lower weight than known equipment, such as, for example, the weight of the heat sink, in other words, the passive cooling device. Instead of reducing the size of the cooling device, more components can also, for example, be arranged within a particular area, since they can be adequately cooled according to the invention. As a result, for example, the dimensions of lamps and corresponding electronic devices can be reduced.

According to the invention, the result is an integration of the cooling and protective functions, which leads to an efficient design at low cost.

Due to the good cooling effect and the prevention of overheating of the cooled components of the equipment, an extended service life is also obtained for the corresponding components.

According to the invention, it is furthermore possible, thanks to the advantages of the invention, to provide the corresponding equipment with a higher performance, where appropriate, and still operate it safely. Of course, the corresponding cooling fluid supply apparatus 3 can be used not only for explosion-protected equipment but also for other equipment in which effective and safe cooling is advantageous. It has already been pointed out that the cooling fluid supply apparatus 3 can supply not only one item of equipment 1 but also a plurality of equipment and possibly also an entire system having a variety of such equipment. The corresponding items of equipment 1 of this system can be connected in parallel and/or in series with the corresponding cooling fluid supply apparatus 3. The safety switching apparatus 7 can be allocated to the particularly critical equipment or can be present in all equipment.

Possible cooling fluids are, for example, oil, distilled water, 3M Novec™, or the like. The cooling fluids can be matched to the maximum permissible surface temperature of the equipment in question; in this regard, see the explanations with respect to the boiling temperature.

The invention claimed is:

1. An electrical/electronic equipment comprising:
   a housing;
   at least one cooling fluid supply apparatus coupled to the housing, the at least one cooling fluid supply apparatus having a cooling fluid inlet, a cooling fluid discharge on the housing and a cooling fluid guide apparatus within the housing; and
   a safety switching apparatus configured to interrupt operation of the at least one cooling fluid supply apparatus in the case of a pressure drop in the at least one cooling fluid supply apparatus, the safety switching apparatus being coupled to the cooling fluid inlet;
   wherein the cooling fluid inlet and/or the cooling fluid discharge have pipe sockets which project outward from the housing and which respectively have a pipe opening that is open toward the housing interior; and
   wherein the safety switching apparatus has at least one valve body to which pressure is applied toward the pipe opening and which is movably mounted between an open position and a closed position, the valve body interrupting a voltage supply to the electrical/electronic equipment upon reaching the closed position.

2. The electrical/electronic equipment according to claim 1, wherein the electrical/electronic equipment is a high-powered lamp, wherein the high-powered lamp further comprises at least one illuminant disposed inside the housing.

3. The electrical/electronic equipment according to claim 1, wherein the housing is of explosion protection type Ex-d, Ex-m, Ex-o, or Ex-p.

4. The electrical/electronic equipment according to claim 1, further comprising a passive cooling device arranged inside the housing and/or on the housing.

5. The electrical/electronic equipment according to claim 4, wherein the cooling fluid guide apparatus has a plurality of fluid channels within at least one of the housing and the passive cooling device, the plurality of fluid channels are arranged at least partially in an area of a heat source.

6. The electrical/electronic equipment according to claim 1, further comprising a spring element mounted within the housing and configured to apply pressure to the valve body.

7. The electrical/electronic equipment according to claim 1, wherein the valve body is coupled to an electrical contact element, the electrical contact element configured to disconnect from an electrical breaker contact in order to interrupt a power supply to the equipment when the valve body is in the closed position.

8. The electrical/electronic equipment according to claim 7, further comprising the breaker contact and a control device, wherein the breaker contact is connected to the control device.

9. The electrical/electronic equipment according to claim 2, further comprising at least one transparent cover facing the illuminant, wherein the housing and the cover are connected to one another by friction welding, adhesive bonding, or ultrasonic welding.

10. The electrical/electronic equipment according to claim 6, wherein the valve body is movably mounted in a bearing sleeve, wherein the spring element is arranged between the bearing sleeve and the valve body.

11. The electrical/electronic equipment according to claim 1, wherein evaporation energy of the cooling fluid is used for additional cooling.

12. The electrical/electronic equipment according to claim 1, wherein a cooling fluid pressure in the area of the cooling fluid inlet is higher than the pressure applied to the valve body.

13. The electrical/electronic equipment according to claim 1, further comprising a heat exchanger arranged outside the housing between the cooling fluid inlet and the cooling fluid discharge.

14. The electrical/electronic equipment according to claim 1, wherein when the valve body is in the closed position, the housing has an explosion protection type of Ex-p.

15. A method for cooling and monitoring electrical/electronic equipment comprising:
   supplying a cooling fluid to a housing of the electrical/electronic equipment via a cooling fluid supply apparatus of the electrical/electronic equipment, the cooling fluid supply apparatus being coupled to the housing, the cooling fluid supply apparatus including a cooling fluid inlet apparatus, a cooling fluid discharge apparatus on the housing, and a cooling fluid guide apparatus within the housing connecting the cooling fluid inlet apparatus and cooling fluid discharge apparatus, the cooling fluid supply apparatus supplying the cooling fluid to the housing via the cooling fluid inlet apparatus;
   opening a safety switching apparatus that is allocated to the cooling fluid inlet apparatus and having the cooling fluid flow into the housing;

closing the safety switching apparatus in response to at least one of a pressure drop in the cooling fluid supply apparatus and a temperature within the housing being above a predetermined temperature; and interrupting a voltage supply to the electrical/electronic equipment when the safety switching apparatus closes;

wherein closing the safety switching apparatus includes moving a valve body of the safety switching apparatus into a closed position, wherein the valve body interrupts the voltage supply to the equipment upon reaching the closed position, and wherein the cooling fluid has a boiling temperature lower than a permissible temperature of the equipment such that in the event of a fault evaporation of the cooling fluid causes the pressure within the housing to rise whereby the valve body is moved to th eclosed position thereby interrupting a power supply to the electrical/electronic equipment.

16. The method according to claim 15, wherein interrupting the voltage supply to the equipment includes opening an electrical breaker contact by moving the valve body into the closed position.

\* \* \* \* \*